(12) United States Patent
Tat-Hin

(10) Patent No.: US 8,219,738 B2
(45) Date of Patent: Jul. 10, 2012

(54) DIRECT INTERCONNECTION BETWEEN PROCESSOR AND MEMORY COMPONENT

(75) Inventor: Tan Tat-Hin, Penang (MY)

(73) Assignee: Spansion LLC, Sunnyvale, CA (US)

( * ) Notice: Subject to any disclaimer, the term of this patent is extended or adjusted under 35 U.S.C. 154(b) by 798 days.

(21) Appl. No.: 11/949,521

(22) Filed: Dec. 3, 2007

(65) Prior Publication Data
US 2009/0144486 A1   Jun. 4, 2009

(51) Int. Cl.
*G06F 12/00* (2006.01)
(52) U.S. Cl. .................. 711/102; 711/E12.001; 361/735
(58) Field of Classification Search .................. 711/102, 711/E12.001; 361/737, 763; 235/441
See application file for complete search history.

(56) References Cited

U.S. PATENT DOCUMENTS

| | | | |
|---|---|---|---|
| 6,098,278 A | 8/2000 | Vindasius et al. | |
| 6,229,158 B1 | 5/2001 | Minemier et al. | |
| 6,255,726 B1 | 7/2001 | Vindasius et al. | |
| 6,276,608 B1* | 8/2001 | Cockayne et al. | 235/492 |
| 6,372,639 B1* | 4/2002 | Stanton | 438/648 |
| 6,507,115 B1* | 1/2003 | Hofstee et al. | 257/777 |
| 6,627,531 B2 | 9/2003 | Enquist | |
| 7,053,314 B1* | 5/2006 | Camerlo | 174/260 |
| 7,495,926 B2* | 2/2009 | Peele | 361/737 |
| 2002/0074668 A1* | 6/2002 | Hofstee et al. | 257/777 |
| 2003/0042512 A1* | 3/2003 | Gonzalez | 257/263 |
| 2005/0283681 A1* | 12/2005 | Jeddeloh | 714/42 |
| 2006/0046453 A1* | 3/2006 | Collins et al. | 438/597 |

OTHER PUBLICATIONS

"Package Technology to Address the Memory Bandwidth Challenge for Tera-scale Computing", http://www.intel.com/technology/itj/2007/v11i3/3-bandwidth/6-architectures.htm, last accessed on Dec. 3, 2007.

Zheng, Xuezhe, et al., http://research.sun.com/vlsi/pubs/04126578.pdf, Optical Transceiver Chips Based on Co-Integration of Capacitively Coupled Proximity Interconnects and VCSELs, IEEE Photonics Technology Letters, Vol. 19, No. 7, Apr. 1, 2007, last accessed on Dec. 3, 2007.

David Sherman, Novel Memory Architecture for System Level Integration, http://www.hotchips.org/archives/hc13/3_Tue/15alpine.pdf, last accessed on Dec. 3, 2007.

George A. Riley, Introduction to Flip Chip: What, Why, How, http://www.flipchips.com/tutorial01.html, Posted Oct. 2000, last accessed on Dec. 3, 2007.

Amkor Technology, http://unitive.com/products/all_datasheets/superFC.pdf, last accessed on Dec. 3, 2007.

Amkor Technology, http://unitive.com/products/all_datasheets/fcCSP.pdf, last accessed on Dec. 3, 2007.

Amkor Technology, Flip Chip Packaging, http://unitive.com/enablingtechnologies/FlipChip/flipchip.pdf, last accessed on Dec. 3, 2007.

Dense-PAC Microsystems, Inc, http://www.tranzistoare.ro/datasheets2/17/175454_1.pdf, last accessed on Dec. 3, 2007.

Keith D. Gann, Neo-Stacking Technology, http://www.irvine-sensors.com/pdf/Neo-Stacking%20Technology%20HDI-3.pdf, last accessed on Dec. 3, 2007.

3D Plus, http://www.3d-plus.com/basic.html, 641, rue Hélène Boucher Z.I. Buc Cedex—France, last accessed on Dec. 3, 2007.

Tom Murphy, Tru-Si Technologies Makes Wafer Stacking a Possibility—Company Business and Marketing, http://findarticles.com/p/articles/mi_m0EKF/is_49_45/ai_58060960, Electronic News, Dec. 6, 1999, last accessed on Dec. 3, 2007.

\* cited by examiner

*Primary Examiner* — Pierre-Michel Bataille
(74) *Attorney, Agent, or Firm* — Turocy & Watson, LLP

(57) ABSTRACT

Conventional processor and memory configurations place holes into silicon or use expensive multi-layer-laminates/substrates to connect the processor with memory. Using a direct contact between the memory and processor allows for signaling between the two units. By judicious arrangement of the contact areas as well as employing other structures such as carriers and redistributors, adequate power and ground supply can be maintained for the processor. Therefore, there is little-to-no damage done to the silicon and expensive multi-layer-laminates/substrates can be avoided. Furthermore, there can be faster processing speeds since the memory and processor are close together.

20 Claims, 13 Drawing Sheets

DIRECT INTERCONNECTION BETWEEN PROCESSOR AND MEMORY COMPONENT

TECHNICAL FIELD

The subject specification relates generally to a computer chip package and in particular to configuration of a processor and memory in a computer chip package.

BACKGROUND

Electronic devices can make use of memory for storage in relation to operations performed by a central processor. A number of different types of memory formats are available to computers. ROM (Read-Only Memory) is a common form of electronic device memory that is a non-volatile memory type written to one time. Non-volatile memory is a storage type that retains data without constantly drawing power (e.g., without being connected to an electrical outlet and being in an 'on' state). ROM systems can read stored data, but ROM systems do not re-write new information upon previously used memory blocks.

Another type of memory typically employed by an electronic device is RAM (Random Access Memory). RAM is a storage type that enables data to be read in a storage sequence independent of order. RAM is commonly the main working area for an electronic device; however, other configurations are possible that use other memory types for a main working area. An electronic device can read the information stored in the RAM as well as write new information to the RAM. However, a problematic feature with RAM is that many types of RAM are volatile memory types (e.g., need to draw from a constant source of power to retain memory).

A common form of RAM is Dynamic Random Access Memory (DRAM); however, other RAM types are available (e.g., Static Random Access Memory). In an integrated circuit, bits of data are saved in individual capacitors. The capacitors lose voltage due to natural leakage and stored data is lost unless there is recharging of the capacitor. The reason for the term Dynamic is that the term refers to a continuous action taking place (e.g., the steady recharging of the capacitor/loss of voltage). There are several variations on DRAM, such as video DRAM

SUMMARY

The following presents a simplified summary of the specification in order to provide a basic understanding of some aspects of the specification. This summary is not an extensive overview of the specification. It is intended to neither identify key or critical elements of the specification nor delineate the scope of the specification. Its sole purpose is to present some concepts of the specification in a simplified form as a prelude to the more detailed description that is presented later.

The subject specification discloses information that relates to configuration of a processor with a memory component. Classically, memory components and processors operate with similar capabilities (e.g., both operate at similar speeds). However, there are vast developments in processor capabilities (e.g., increased bandwidth); conversely, there have not been the same developments in memory capabilities. Therefore, conventional configurations do not take advantage of processor capabilities due to relatively poor memory capabilities.

In the subject specification, a processor and memory component have contact areas that engage one another to allow for communication between the two units. Thus, the units are physically close together, which allow for both faster interaction as well as transmission of greater amounts of information. The processor and memory component can adhere to one another in order to stay in an engaged state that produces desirable results. Moreover, various embodiments of the subject specification enable improved performance. For instance, the memory components can be placed within a substrate to allow for a more compact configuration and closer distance between the processor, memory component, and substrate.

Independent memory components, processors, and substrate can be manipulated in order to create a single configuration. An arrangement component aligns contact areas of at least one memory component and at least one processor. An engagement component connects aligned contact areas. Various tests can be performed by an analysis component to determine if a configuration is acceptable. A package manufacturing process creates slots/recesses in a package level substrate to allow for insertion of the memory component of a newly created unit (e.g., processor integrated with a memory component). The memory component portion is then placed in a substrate depression, latched upon the substrate directly, connected to a substrate support, etc.

The following description and the annexed drawings set forth certain illustrative aspects of the specification. These aspects are indicative, however, of but a few of the various ways in which the principles of the specification can be employed. Other advantages and novel features of the specification will become apparent from the following detailed description of the specification when considered in conjunction with the drawings.

DETAILED DESCRIPTION

Figure 1:
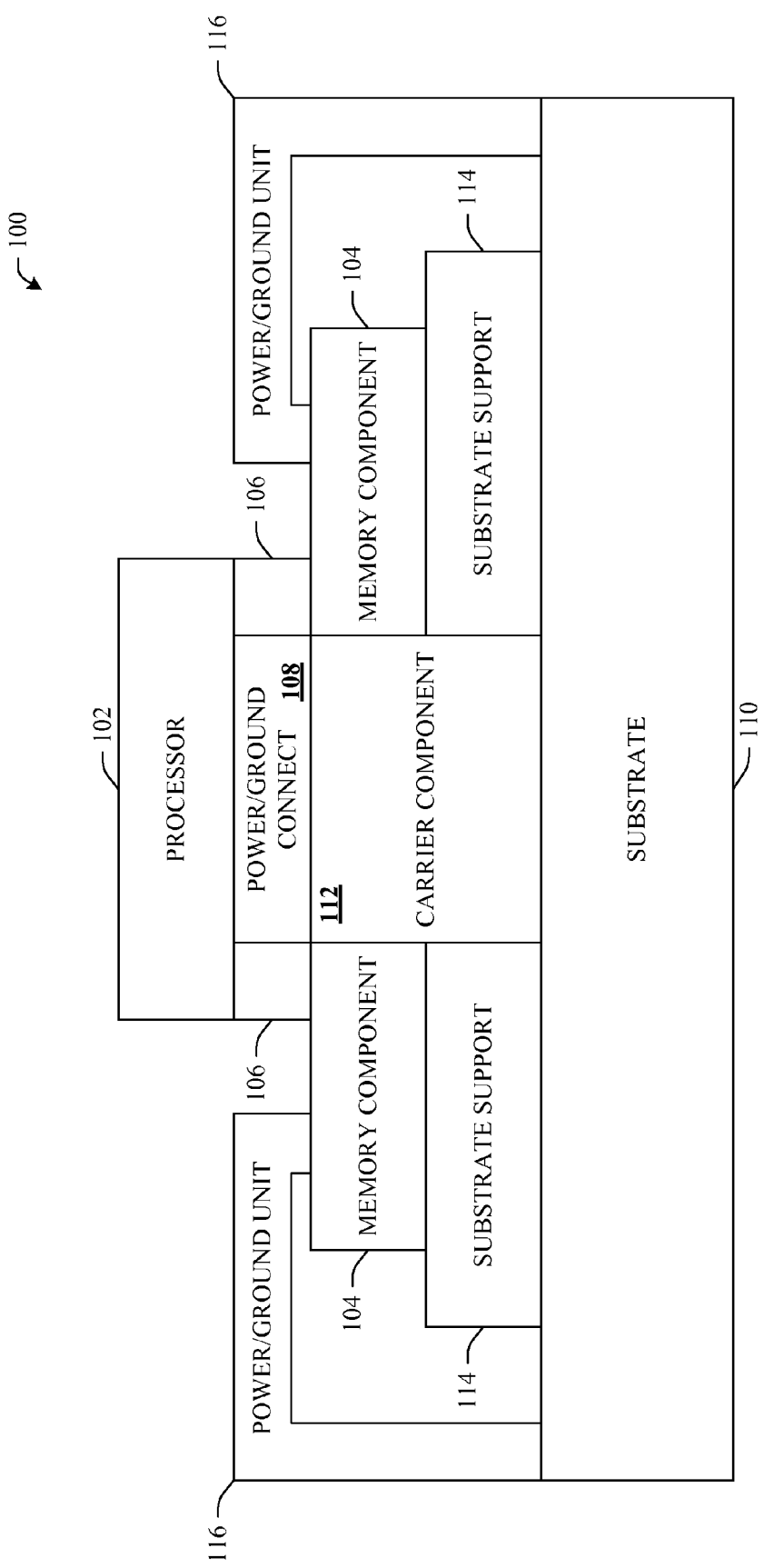
FIG. 1 illustrates a representative processor and memory component configuration in accordance with an aspect of the subject specification.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It can be evident, however, that the claimed subject matter can be practiced without these specific details. In other instances, well-known structures and devices are shown in block diagram form in order to facilitate describing the claimed subject matter.

As used in this application, the terms "component," "module," "system", "interface", or the like are generally intended to refer to a computer-related entity (e.g., operating a manufacturing process, fabrication method, etc.), either hardware, a combination of hardware and software, software, or software in execution. For example, a component can be, but is not limited to being, a process running on a processor, a processor, an object, an executable, a thread of execution, a program, and/or a computer. In specific examples, a component can be a method by which a multi-chip-module is fabricated or the multi-chip-module itself; one or more components can reside within a manufacturing process or method of manufacture or it can encompass the entire manufacturing process. By way of illustration, both an application running on a controller and the controller can be a component. One or more components can reside within a process and/or thread of execution and a component can be localized on one computer and/or distributed between two or more computers. As another example, an interface can include I/O components as well as associated processor, application, and/or API components.

Furthermore, the claimed subject matter can be implemented as a method, apparatus, or article of manufacture using standard programming and engineering techniques. The term "article of manufacture" as used herein is intended to encompass a combination of firmware, hardware and software to control machinery to implement the disclosed subject matter. Of course, those skilled in the art will recognize many modifications can be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

FIG. 1 discloses an example package configuration 100. A processor 102 can operate as a central control unit of an electronic device (e.g., cellular telephone, portable music player, coffeemaker, etc). Sophistication of a processor (e.g., processor speed, bandwidth, etc.) is commonly dependent on a task the processor is to perform. As processors become more complex, the greater the desirability to have a configuration that allows for improved performance with both the processor 102 and how the processor interacts with other components.

Often times, a processor 102 communicates with a memory component 104 to perform an operation. The memory component 104 can configure in a number of different manners including Random Access Memory (RAM), Read Only Memory (ROM), flash memory, etc. In the configuration 100, the processor 102 and the memory component 104 are bonded together. For example, bonding can take place through use of a special adhesive (e.g., glue) with electrically conductive properties. It is to be appreciated that while some devices are discussed singularly (e.g., memory component 104), the corresponding drawing can disclose multiple units. Information disclosed for a single unit can correspond to multiple drawn units (e.g., information stated about the memory component 104 applies to both drawn memory components 104.)

The processor 102 and the memory component 104 can have active contact area(s) (e.g., one or more contact areas) located along at least part of their respective periphery that allow them to communicate with one another when the areas are engaged. The processor 102 and/or memory component 104 can configure to have an active area on one side. For instance, a bottom portion of the processor 102 can have contacts while the top portion of a memory component holds contacts; however, the processor 102 and/or memory component 104 can surround with contacts (e.g., contact area on multiple processor sides). When the contacts engage together, the processor 102 and the memory component 104 can send signals between one another. Thus, the processor 102 and memory component 104 can communicate through an interface of a processor active contact area and a memory active contact area. According to one embodiment, the contacts of both the processor 102 and the memory component 104 are silicon portions. Signals can transfer over a signal connect 106, where the signal connect 106 is typically made of contact area(s) of the processor 102 and the memory component 104 as well at least one solder (e.g., solder balls, solder bumps, solder bonds, etc); the signal connect 106 is an example interface. Other connective capabilities are possible, such as using an adhesive (e.g., with electrically conductive properties) that allows signals to pass to connect the processor 102 with the memory component 104. It is to be appreciated that while two memory components 104 are disclosed, other arrangements can be performed (e.g., four memory components to one processor, two processors to one memory component, etc).

Placing the processor 102 and the memory component 104 physically close together can lead to improved performance in memory access (e.g., improved speed and bandwidth). For instance, a shorter physical distance allows for less travel time between signals traveling between the processor 102 and the memory component 104. Furthermore, since large contact areas are utilized, a large amount of information can travel between units at one time (e.g., a larger pathway is available.)

For beneficial operation, the processor 102 receives a predetermined level of power (e.g., provided a voltage sufficient to operate). In addition, the processor 102 is grounded in accordance with general electrical principles (e.g., electricity is provided a return path.) The processor 102 can utilize a power/ground connect 108 to obtain the requisite power and ground. The power/ground connect 108 can be arranged as a set of pins used to conduct voltage and ground. Commonly, the processor 102 receives power through a non-periphery active contact area (e.g., middle contact area not of an edge). Memory component 104 can also receive power and ground through wire bonds, a heat sink, a metal enclosure, an independent power and ground connect, etc. In addition to the processor 102 using a power/ground connect 108, the memory components 104 can utilize a power/ground connect 108.

A substrate 110 can be used to provide the power and ground to the processor 102 and to provide signal routing to connect the processor 102 and memory component 104 externally to other electronic components. The substrate 110 can be made of a multi-layer package laminate. The laminate material could be organic or ceramic.

A carrier component 112 can function as a conduit for power and ground between the power/ground connect 108 and the substrate 110. A substrate support 114 can be a physical entity used to provide structural assistance to the memory component 104 while providing minimal physical damage/limitations upon the substrate. According to one configuration, since contact pads of the memory component 104 are located on an upper portion of the memory component 104, a power/ground connect 116 wraps around to engage a top of the memory component 104.

Operation of the configuration 100 can provide a number of advantages over conventional arrangements. For instance, some arrangements create holes in areas to connect units (e.g., creating a hole in a wafer portion). Using adhesive or solder bond does not damage configuration components and the configuration 100 can have improved operations since there is less physical damage to critical areas. Some arrangements use capacitors as opposed to contacts, but if there is a relatively small misalignment, then there can be vastly undesirable results. Since the configuration 100 uses a contact area, there is a relatively high allowance for a tolerance of misalignment in achieving desired results.

Figure 2:
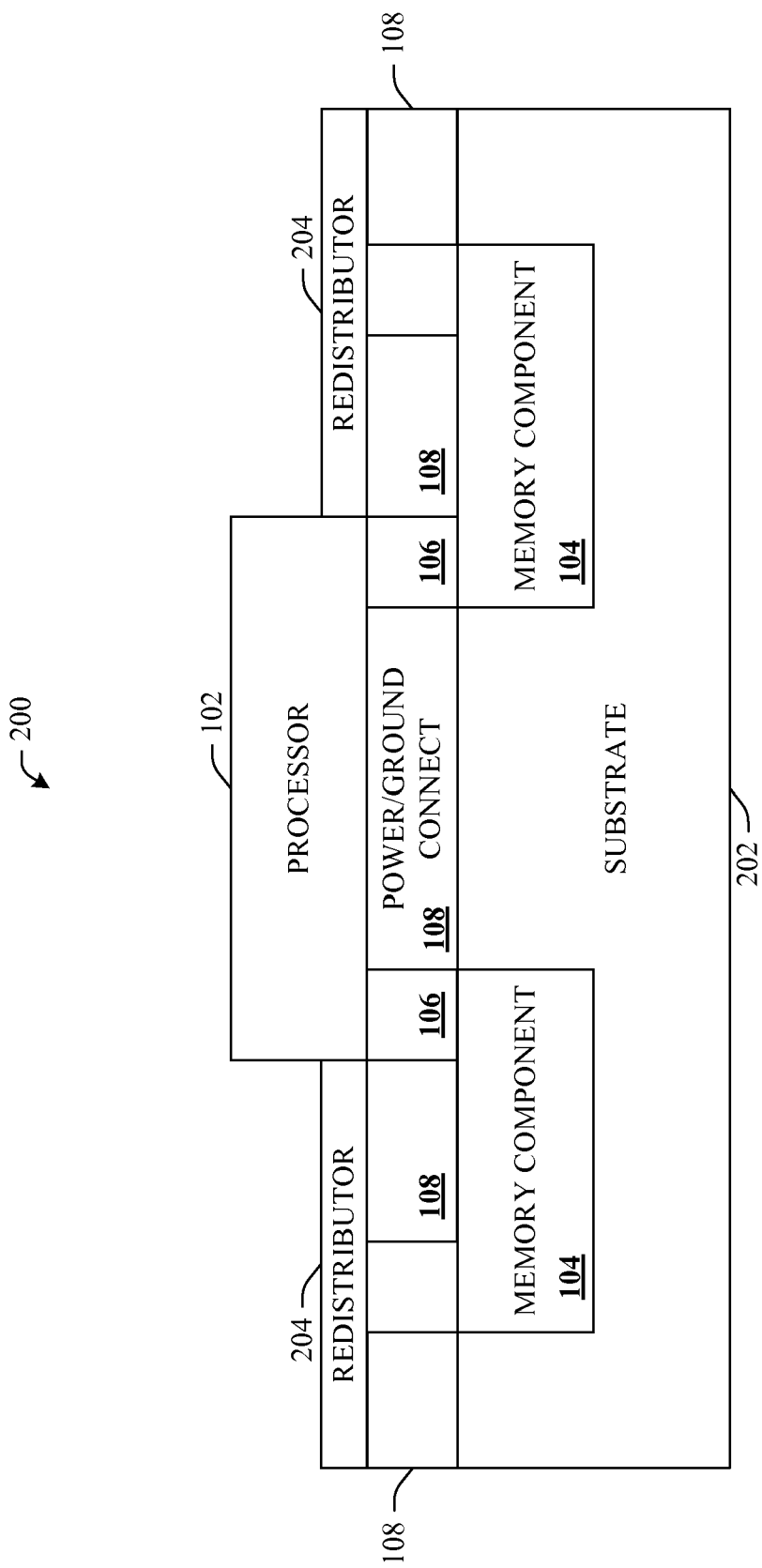
FIG. 2 illustrates a representative configuration with a memory component placed in a substrate recess in accordance with an aspect of the subject specification.

FIG. 2 discloses an example processor 102 and memory component 104 configuration 200 with recesses in a substrate 200. A processor 102 can communicate with a memory component 104 through utilization of a signal component 106. The signal component 106 can function as a medium in which information can be sent between the processor 102 and the memory component 104. The signal component is made of contact areas of the processor 102 and memory component 104.

A substrate 202 can be used to provide power to the processor 102 through a power/ground connect 108. The substrate 202 can perform various other types of functionality (e.g., perform insulation functions). In addition, the substrate 110 of FIG. 1 and the substrate 202 can share characteristics and be the same substrate in different states (e.g., substrate 110 of FIG. 1 has no recesses while substrate 202 has recesses.) The processor 102 can be directly supplied power and/or ground from the substrate 202 without use of a carrier component 114 of FIG. 1; however, a carrier component 114 of FIG. 1 can be utilized.

In order to create a more compact design, recesses can be placed in the substrate 202. A recess of the substrate 202 can be used to hold the memory component 104. Placement of the memory component 104 into the recess of the substrate 202 can provide a number of benefits to the configuration 200. The overall height of the configuration 200 can be reduced if the memory component 104 does not have to stack directly upon the substrate 202, but rather fits into the substrate 202. The recesses can be deep enough to surround the memory component 104; however, the memory component 104 can partially rise above the substrate 202 if the recesses are relatively shallow.

Various features can integrate with placement of the memory component 104 within part of the substrate 202. An adhesive can be utilized in order to secure the memory component 104 to the substrate 202. When operating, various electrical components can produce secondary results that can affect other units. For instance, a memory component 104 can generate a level of heat that can cause alterations upon the substrate 202. Therefore, a boundary can be placed between the memory component 104 and the substrate 202 that lowers the amount of heat felt by the substrate 202 (e.g., an adhesive with heat transfer properties).

The memory component 104 can receive power and ground connections through a number of different embodiments. The memory component 104 can receive power and/or ground through a redistributor 204 that utilizes a power/ground connect 108 to draw from the substrate 102 and provide to the memory component 104. In one configuration, the redistributor 204 obtains power and/or ground from the substrate 202 and transfers it to the memory component 104.

Figure 3:
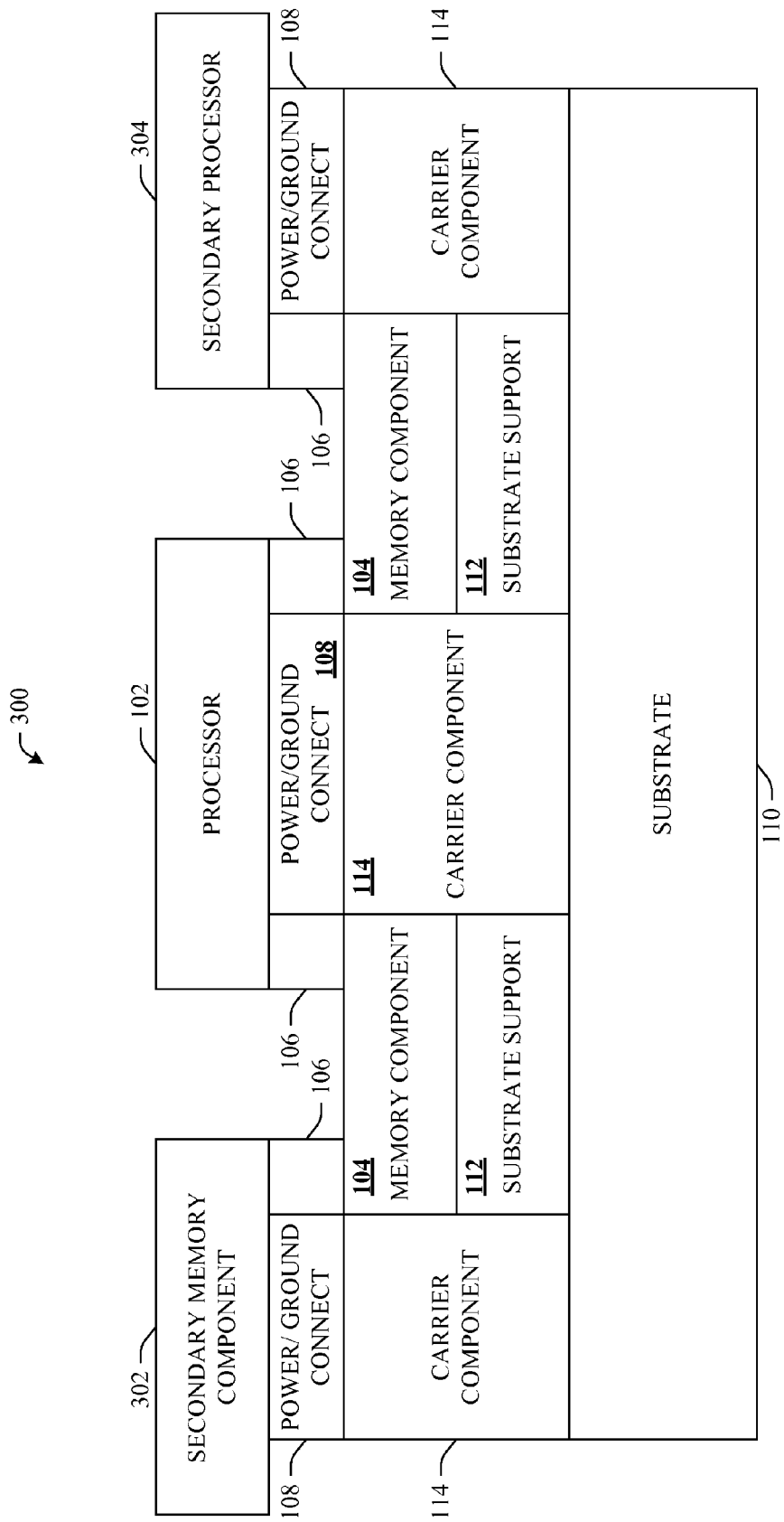
FIG. 3 illustrates a representative configuration with multiple memory components and processors in accordance with an aspect of the subject specification.

FIG. 3 discloses a configuration 300 with multiple processor and memory components. Components function in a similar manner as disclosed with regard to other drawings of the subject specification. A processor 102 operates as a control unit of a configuration 300 that accesses a memory component 104 to perform at least one operation. Communication between the processor 102 and memory component 104 can take place through engagement of respective contact areas that form a signal connect 106. Two memory components 104 are shown that form signal connects 106 with the processor 102.

The processor 102 and memory component 104 can obtain power from a substrate 110, which can be a multi-layer organic or ceramic laminate. Power and/or ground can travel to the memory component 104 through a support and/or redistributors that is not shown. The substrate support 112 functions to hold the memory component 104 structurally. Since the processor 102 can configure to be a relatively long distance from the substrate 110, a carrier component 114 can be employed to transmit power and ground to the processor 102.

The configuration 300 can also employ at least one secondary memory component 302 and/or at least one secondary processor 304. The secondary memory component 302 can employ a separate power/ground connect 108 as well as a separate carrier component 114. The secondary memory component 302 allows for greater memory storage in a device operating the configuration 300. The secondary memory component 302 can stack on top of the memory component 104, thus creating a more compact design. According to one embodiment, the memory component 104 and secondary memory component 302 are near identically structured. However, there is a difference is in how they operate (e.g., the memory component 104 directly communicates with the processor while the secondary memory component 302 communicates with the processor indirectly through the memory component 104 utilizing signal contacts 106 twice.) A contact area of the secondary memory component 302 can be used to enable communication between it and the memory component 104 (e.g., signal connect 106 forms between the memory component 104 and the secondary memory component 302.) The secondary processor 304 can function in a similar manner to the secondary memory component 302. The secondary processor 304 can operate in assistance to the processor 102 or can function independent of another processor.

Figure 4:
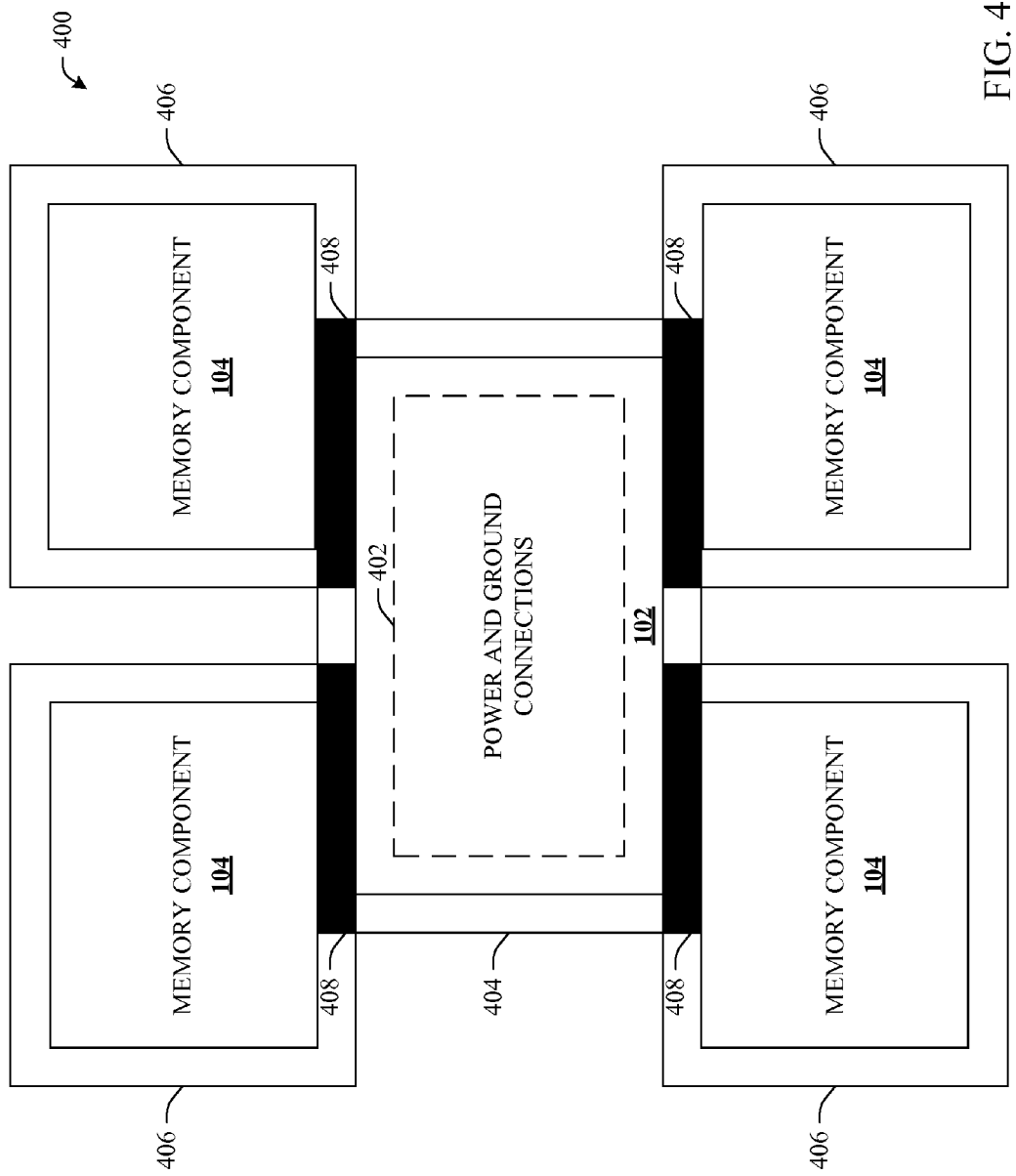
FIG. 4 illustrates a representative multiple memory component configuration in accordance with an aspect of the subject specification.

FIG. 4 discloses a top view of a multiple memory component configuration 400. One processor 102 can support communication with multiple memory components 104. Thus, at least two memory components 104 can communicate with the processor 102 through a processor active contact area. The entire surface of the processor 102 can configure with an active contact area that allows for communication with other devices. At least some of the area that is not used by the processor 102 for communication with memory components 104 can be used to supply power and ground connection 402 to the processor 102. Power and ground connections 402 enable the processor to operate within a device utilizing the configuration 400. The power and ground connections 402 can operate as a contact area and allow the processor 102 to receive power through a non-periphery active contact area. The memory component 104 and the processor 102 communicate through engagement of contact areas 404-406 located along respective peripheral areas (e.g., contact area located on only one side of the memory component 104 and/or processor 102). There can be processor contact areas 404 and memory component contact areas 406; contact areas 404-406 can physically touch and become an interface 408.

Figure 5:
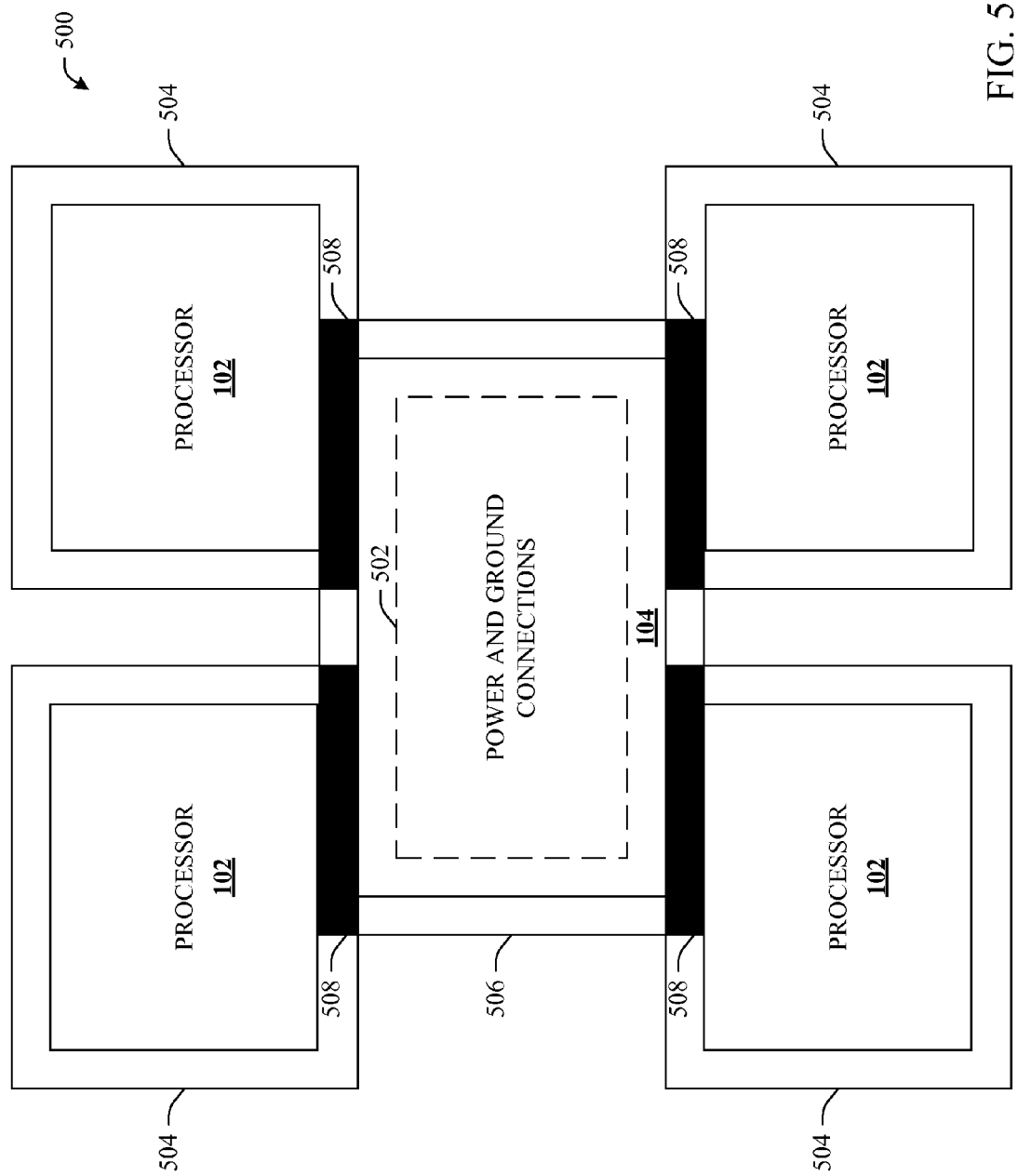
FIG. 5 illustrates a representative multiple processor configuration in accordance with an aspect of the subject specification.

FIG. 5 discloses a top view of a multiple processor configuration 500. One memory component 104 communicates with multiple processors 102 such that the different processors 102 can store and access common information in the memory component 104. With the configuration 500, at least two processors 102 can communicate with the memory component 104 through a memory active contact area. The memory component 104 can integrate with a surrounding contact area that is used for engagement of other components (e.g., processor 102, secondary memory component 302 of FIG. 3, secondary processor 304 of FIG. 3, etc.). Contact area that is not used for connection with other devices can be used to create power and ground connections 402 that allow the memory component to function properly. The power and ground connections 502 can operate as a contact area and allow the memory component 104 to receive power through a non-periphery active contact area. The memory component 104 and the processor 102 communicate through engagement of contact areas 504-506 located along respective peripheral areas (e.g., contact area located on only one side of the memory component 104 and/or processor 102). There can be processor contact areas 504 and memory component contact areas 506; contact areas 504-506 can physically touch and become an interface 508.

Figure 6:
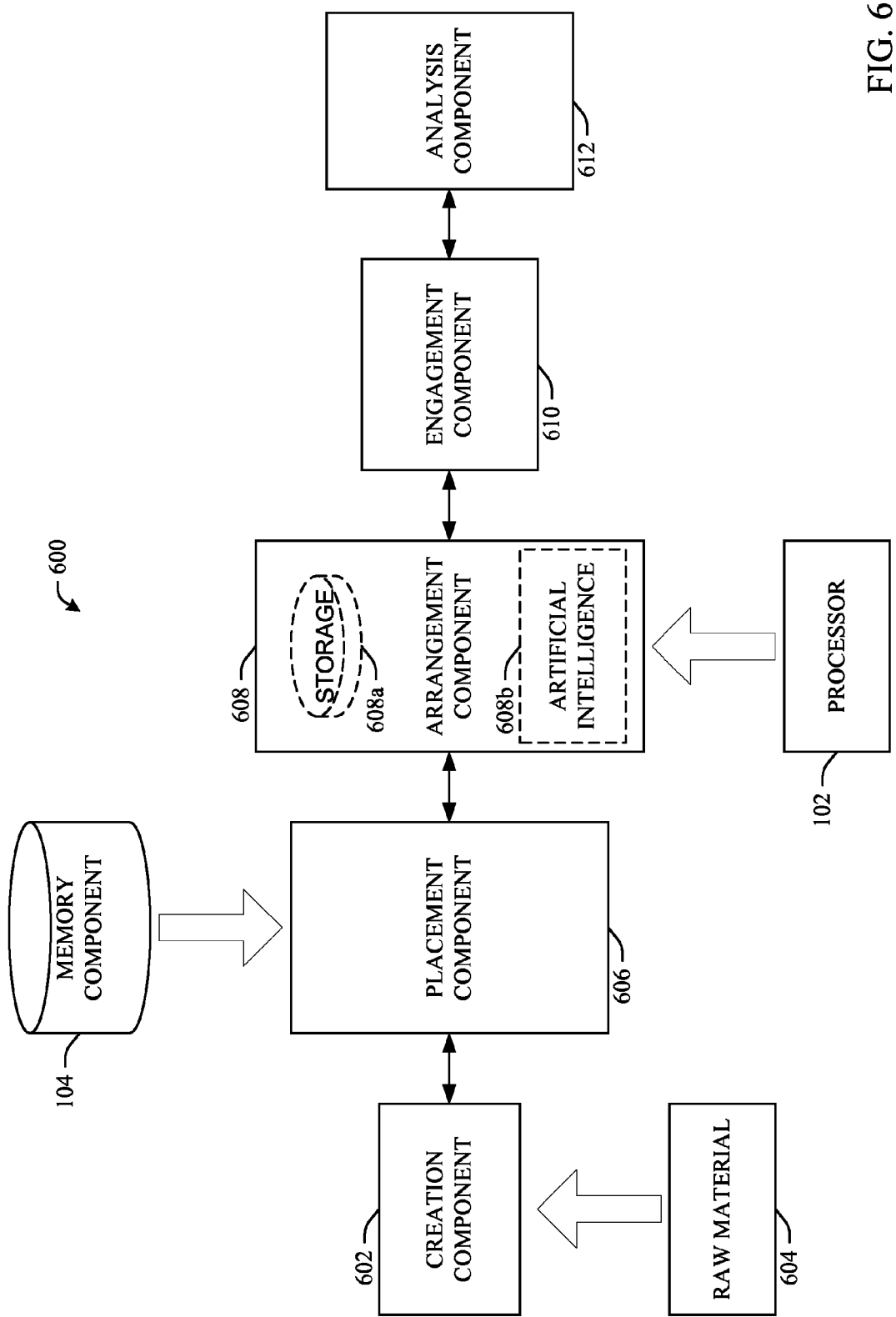
FIG. 6 illustrates a representative configuration construction system in accordance with an aspect of the subject specification.

FIG. 6 discloses an example construction system 600 for creation of the configuration 200 of FIG. 2 as well as other configurations (e.g., configuration 100 of FIG. 1). A processor 102 and memory component 104 can be created through different procedures. In addition, the processor 102 and memory component 104 can be made by different manufactures and thus have different characteristics (e.g., different tolerances for error, different sizes, etc.).

A creation component 602 can gather raw material 604 can build a substrate, such as the substrate 110 of FIG. 1. Commonly, the raw material is organic laminate material, ceramic laminate material, etc. In order to build a substrate 202 of FIG. 2, the creation component 602 can use various procedures. For instance, one laminate portion can be divided though application of a saw where divisions are large enough to receive a memory component 104. The creation component 602 takes the divided laminate portion and presses it against a larger laminate portion to create a single substrate 202 of FIG. 2. The creation component can operate as a means for creating a laminate capable of holding the processor engaged with the memory. This includes a standard laminate substrate, laminate substrate with depressions, etc.

A placement component 606 receives the substrate from the creation component 602 as well as a memory component 104. The placement component can operate as a means for placing the memory at least partially into the recess portion of at least one laminate. It is to be appreciated that the placement component 610 can operate with a non-recessed substrate 110 and the placement component 610 attaches the memory component 104 directly to the substrate, to a substrate support 112 of FIG. 1, another unit, and the like.

An arrangement component 608 lines contact areas of the memory component 104 and a received processor 102. Different memory components 104 (e.g., flash memory, RAM, etc.) and processors 102 (e.g., central processing unit, graphical processing unit, etc.) can enter the arrangement component 608. The arrangement component 608 can determine where contact areas are for different units. This can be done by use of internal storage 608a, artificial intelligence 608b, etc. This allows the arrangement component 608 to function as a means for arranging an active contact section of a processor with an active contact section of memory.

In an illustrative example of using internal storage 608a, the arrangement component 608 holds a directory for contact areas of different devices in the internal storage 608a. The arrangement component 608 can configure with a communication component that accesses external storage in the same manner internal storage 608a is accessed. Artificial intelligence 608b can be used to make at least one inference or at least on determination or at least one of each for how to align at least on contact area of a processor with at least one contact area of a memory component.

Artificial intelligence 608b can employ one of numerous methodologies for learning from data and then drawing inferences and/or creating alignments from the models so constructed (e.g., Hidden Markov Models (HMMs) and related prototypical dependency models, more general probabilistic graphical models, such as Bayesian networks, e.g., created by structure search using a Bayesian model score or approximation, linear classifiers, such as support vector machines (SVMs), non-linear classifiers, such as methods referred to as "neural network" methodologies, fuzzy logic methodologies, and other approaches that perform data fusion, etc.) in accordance with implementing various automated aspects described herein.

Methods can also include methods for the capture of logical relationships such as theorem provers or more heuristic rule-based expert systems. Inferences derived from such learned or manually constructed models can be employed in optimization techniques, such as linear and non-linear programming, that seek to maximize some objective function. For example, aligning contact areas to produce maximum conductivity between a processor 102 and memory component 104. In addition, the arrangement component 608 can configure to attach multiple processors 102 with multiple memory components 104 (e.g., one memory component 104 with two processors 102, one processor 102 with two memory components 104, two processors 102 with two memory components 104, etc.).

An engagement component 610 attaches the processor 102 and memory component 104 together to create a single unit. An adhesive application component can be employed by the engagement component to use a glue or a solder bond application component to bind the processor 102 and engagement component 104 together. The engagement component 610 can operate as a means for engaging the processor with the memory, where contact pads of a processor and the contact pads of the memory component 104 link.

An analysis component 612 determines functionality of the unit created by the engagement component 610. The analysis component 612 can function as a means for analyzing the processor engaged with the memory. When a unit is created, it can include errors that make the unit undesirable for use in an electronic device. The analysis component 612 can test the unit according to a programmed standard. If a unit does not meet set specifications, then it can be disregarded or re-cycled through, separated (e.g., countering combination made at the engagement component 610), and placed into the arrangement component 608 and/or the placement component 606.

Figure 7:
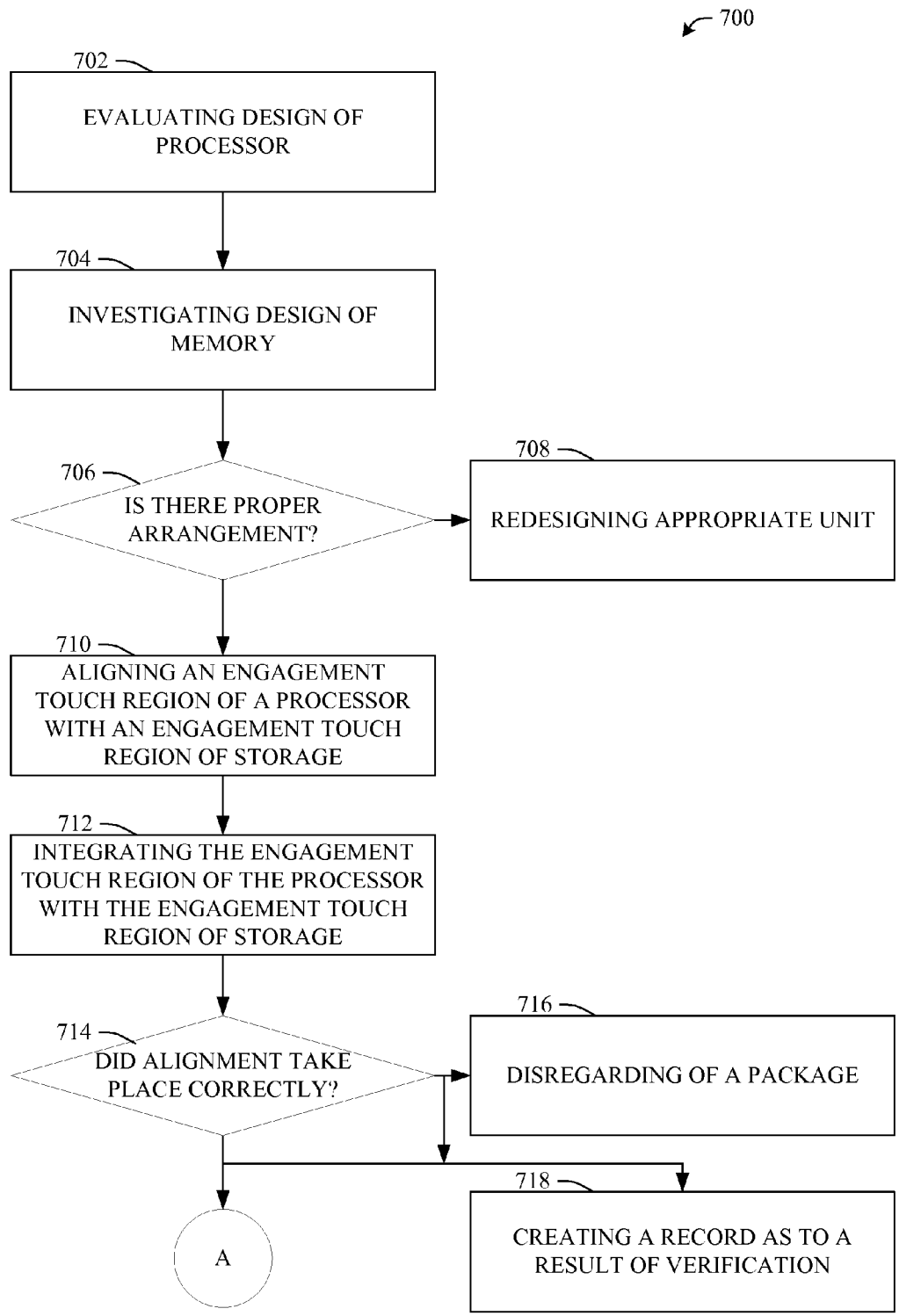
FIG. 7 discloses a first part of a representative configuration build methodology in accordance with an aspect of the subject specification.
Figure 8:
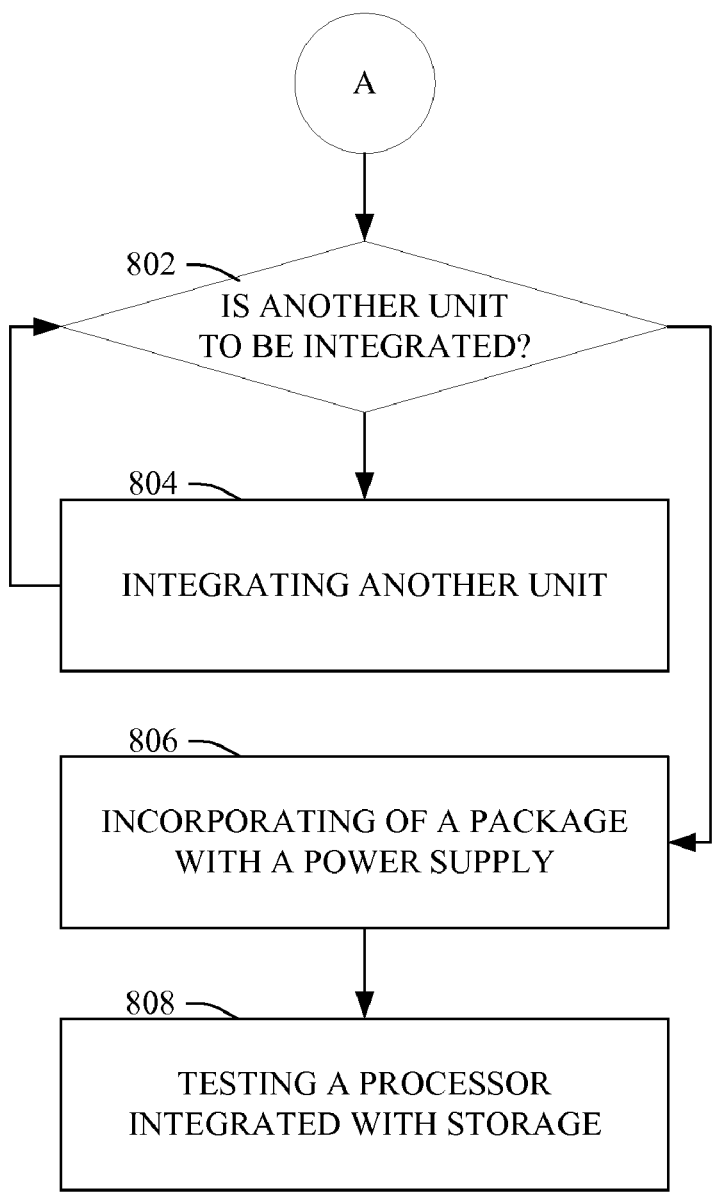
FIG. 8 discloses a first part of a representative configuration build methodology in accordance with an aspect of the subject specification.

FIG. 7 and FIG. 8 disclose an example methodology 700 for construction of a unit, where the unit can have at least two processors and/or at least two memory components. There can be evaluating design of a processor 702. Determinations are made concerning structural components of the processor (e.g., there is locating placement of contact pads) and other properties of the processor. Investigating design of memory 704 occurs. Appraisal takes place for physical portions of the memory (e.g., where contact or touch regions are placed) and other attributes of the memory. An inspection 706 occurs to learn if the memory and/or the processor meet specification (e.g., contact pad on memory and/or the processor are located on outer areas, a unit is capable of receiving power through a middle portion, etc.). If specification is not met, then there is redesigning appropriate unit(s). This can include modifying a unit, disregarding a unit, etc.

Aligning an engagement touch region of a processor with an engagement touch region of storage 710 can occur. Alignment can take place accordance to a number of different embodiments, including optical alignment, estimation, use of a template, etc. Alignment is commonly performed in a manner that allows communication between a processor and memory component if the memory component and processor are linked.

Act 712 can be integrating the engagement touch region of the processor with the engagement touch region of storage. Integration creates a medium in which a processor and storage can communicate with one another. The integration can be a hard (e.g., the processor and storage will likely be damaged if there is removal) as well as soft (e.g., the processor and storage are easily removable).

A check 714 occurs to determine if an alignment took place correctly. A correct alignment can be a relative measurement and different implementations of the methodology 700 can have different standards. Commonly, the check 714 occurs through use of diagnostic testing.

If the alignment did not take place correctly, then there is disregarding of the package 716. A disregarded package can be thrown away, pieces removed and recycled to action 710, etc. Regardless of the outcome of check 714, there can be creating a record as to a result of verification (e.g., check 714) 718. Record keeping can be a beneficial tool in operation of the methodology 700. If a relatively large number of misalignments have occurred, then it can be an indication there is an error in methodology operation (e.g., a physical part is broken.) Commonly, record creation takes place upon a database that can be accessed by various network devices. The record can be saved numerous places, including locally as well as remotely. If alignment did take place correctly, then the methodology 700 can perform other actions.

A second check 802 can take place if another unit (e.g., processor, memory component, etc.) is to be integrated into a package. If another unit is to be added, then there is integrating another unit 804 into the package. It is possible that a final package is to have more then one processor and/or storage. While disclosed returning to check 802, it is possible that the methodology 700 return to other actions to allow for integration (e.g., event 710). A determination is made at action 802 if another unit is to be added. According to one embodiment, a check is made against a creation order located on the database that holds a record created at 802. The creation order can also hold information, such as when the methodology 700 should commence with action 710.

If another unit is not to be added (e.g., the package is to be made by the methodology 700 with one processor and one storage), then there can be incorporating of a package with a power supply 806. Incorporating storage with a power supply can include incorporating at least one processor with the power supply and/or incorporating at least one storage with the power supply. Commonly, incorporation can take place through application of the package with a substrate. Event 806 can include aligning a power or ground carrier to a non-periphery contact region of a processor or integrating the non-periphery contact region of a processor with the power or ground carrier. Moreover, event 806 can include aligning a power or ground connector to a non-periphery contact region of a storage memory or integrating the power or ground connector with the storage memory.

Event 808 is testing a processor integrated with storage. A final created package can be tested to ensure the package is fit to be placed in an electronic device. This can be a more advanced diagnostic check then what took place at check 706. Furthermore, event 808 can overlap what takes place at check 714 and make a determination if alignment is correct after further actions of the methodology 700 occur.

Figure 9:
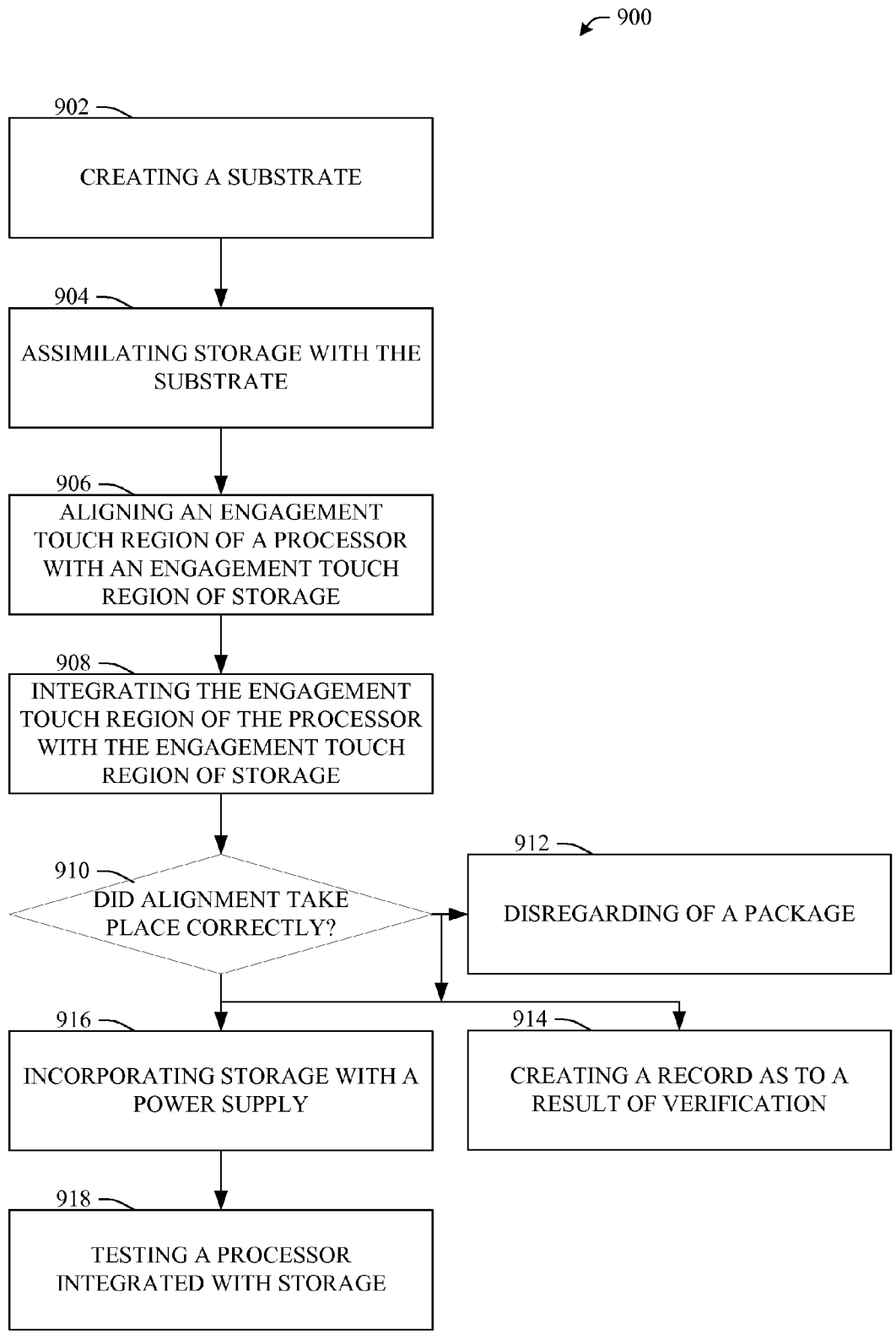
FIG. 9 discloses a representative recessed substrate configuration build methodology in accordance with an aspect of the subject specification.

FIG. 9 discloses an example methodology 900 for construction of a unit where substrate recesses are used to receive a portion of a device. There is creating a substrate 902, typically from a laminate structure. In addition, a substrate can have at least one depression (e.g., slot, recess, etc.) for holding storage. The recess can be made through creating at least one division in a laminate material and adding divided material to other laminate to make a single structure, making a depression, etc. Event 904 is assimilating storage with the substrate. Assimilation can take place through using of an adhesive, heat bonding, coupling, etc. In addition, action 904 can include placing storage into a depression of a substrate.

Event 906 is aligning an engagement touch region of a processor with an engagement touch region of storage. Commonly, alignment is performed with a goal of creating an effective contact region between the processor and the storage that allows communication between units when ultimately integrated. According to one embodiment, alignment is performed by a computer processes that uses a template to align the storage and/or processor. Alignment can take place in conjunction with another action, such as determining where a contact portion region is located on storage and/or a processor. Furthermore, event 906 can occur through an optimization and/or an optimization with a tolerance (e.g., a best alignment, an alignment that is in about top 5% possible, an alignment that is an improvement over an average random alignment, etc.).

Integrating the engagement touch region of the processor with the engagement touch region of storage 908 occurs. Integration allows a medium for communication of digital signal information to form. One form of integration allows for bi-directional communication, where signals can be sent from the processor to the storage as well as from the storage to the processor. Integration can take place though physically joining engagement touch regions of the processor and the storage through solder, adhesive, etc.

A check 910 can occur that verifies that an alignment took place according to a specification. A specification can be a set of rules that are used to determine if an alignment is correct. For example, a specification can include measurements with tolerance for conductivity, speed, signal strength, etc. It is possible that the check 910 operates more then once. For instance, if the check results in a 'no' answer, then the check can be re-run to make sure an appropriate result was achieved.

If the check 908 determines that alignment did not occur correctly, then there is disregarding of a package 912. Disregarding a package can take a number of forms. For instance, a disregarded package can be separated and realigned. However, a disregarded packaged can be sent to another process and the package can be placed in another product (e.g., a low quality product). Moreover, a disregarded packaged can be disposed (e.g., placed in a garbage bin).

Regardless of a result of the check 908, there is creating a record as to a result of verification 914. A record can be used to determine effectiveness of the methodology 900. For instance, if the methodology 900 is aligning processors with storage at an adequate rate, this can be published to other devices capable of running the methodology 900. These other devices can employ the methodology 900 due to its success rate.

If alignment occurred in a desirable manner (e.g., at a desired tolerance), then there is incorporating storage with a power supply 916. In order to function properly, the storage can be combined with a power supply that includes a ground connection. A power supply can be important in storage operation. For instance, if the storage is RAM, then to retain information, the storage should draw from a constant source of power. Therefore, incorporation of a power supply allows the storage to function in a desirable capacity. Example incorporation is using a redistributor to provide power to storage.

Testing a processor integrated with storage 918 can take place. Prior to a package entering an electronic device, a test can determine if the package performs as expected. Since packages can be placed into expensive electronic devices, it can be detrimental if the package does not function properly and holds a high likelihood of damaging an electronic device. Furthermore, packages can be placed in an electronic device in a configuration that makes them difficult to remove. Therefore, if the package is placed in the electronic device and the package fails to work to an acceptable standard, then it can be costly to replace the package and can be more cost-effective to dispose of the electronic device.

Figure 10:
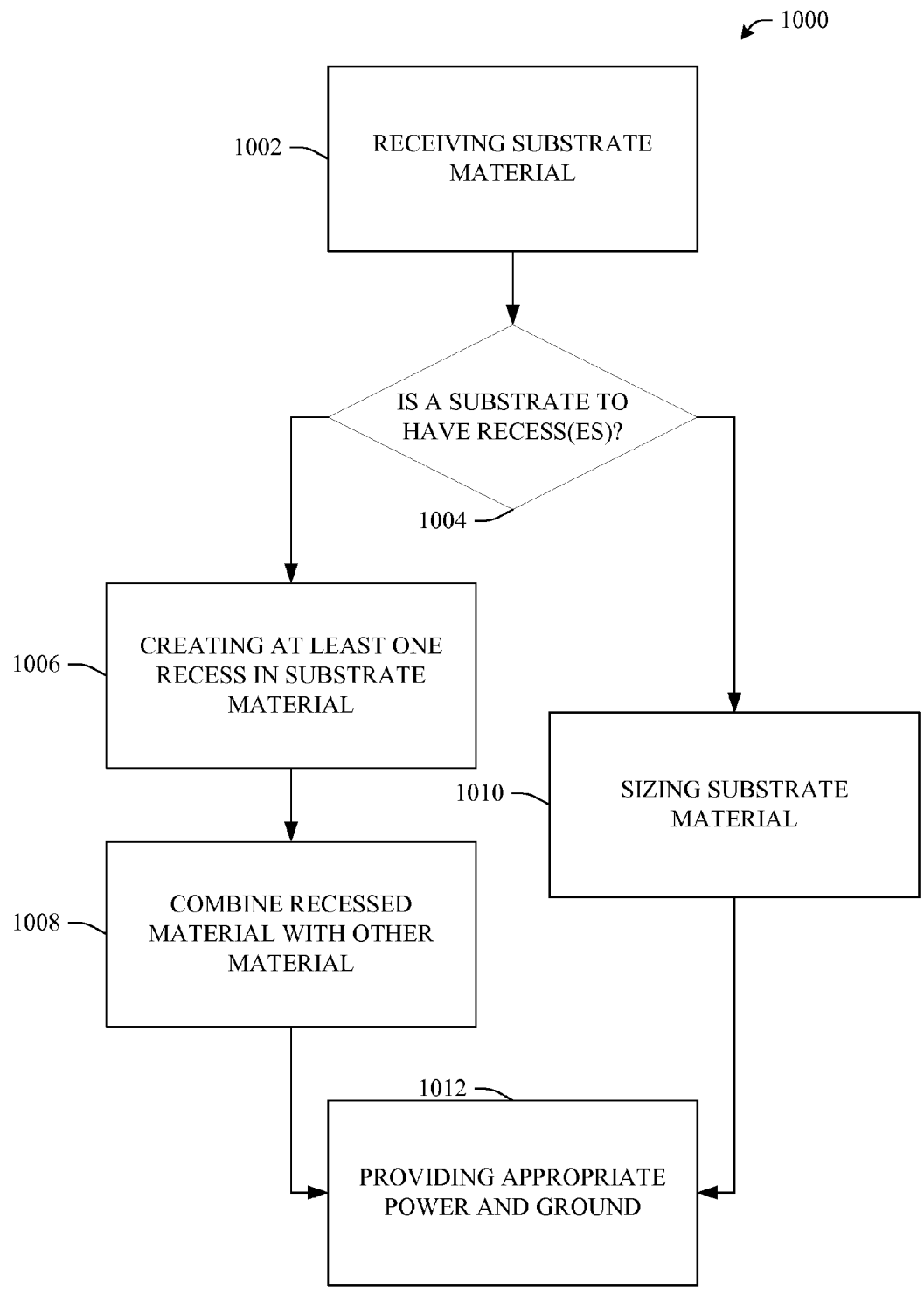
FIG. 10 discloses a representative substrate creation methodology in accordance with an aspect of the subject specification.

FIG. 10 discloses an example methodology 1000 for creating a substrate. There is receiving substrate material 1002; common materials include organic laminates, ceramic laminates, etc. A check 1004 takes place to determine if a substrate is to have at least one recess. If there is to be at least one recess in the substrate, then creating at least one recess in substrate material 1006 occurs. Recess creating can take place according to a number of different embodiments. For instance, a recess is created through drilling laminate raw material with a laser, saw, drill, or pressure jet.

After recess creation, there is combining material with other material 1008 (e.g., at least partially non-recessed substrate material, non-recessed substrate material, substrate material with structural supports, etc.). This can occur through applying a template to provide structural support to material with recesses then pressing the recess material and non-recess material together. If there is not to be at least one recess, then there can be sizing substrate material 1010 (e.g., shaping substrate material so it meets size specifications, preparing substrate for further actions, etc.).

Regardless if a substrate is to have at least one recess, there is providing appropriate power and ground the substrate 1012. Since various components (e.g., processor, storage, etc.) can utilize power and ground in operation, action 1012 allows the components to operate adequately. This can include integrating a substrate with a carrier component that can attach to a processor.

Figure 11:
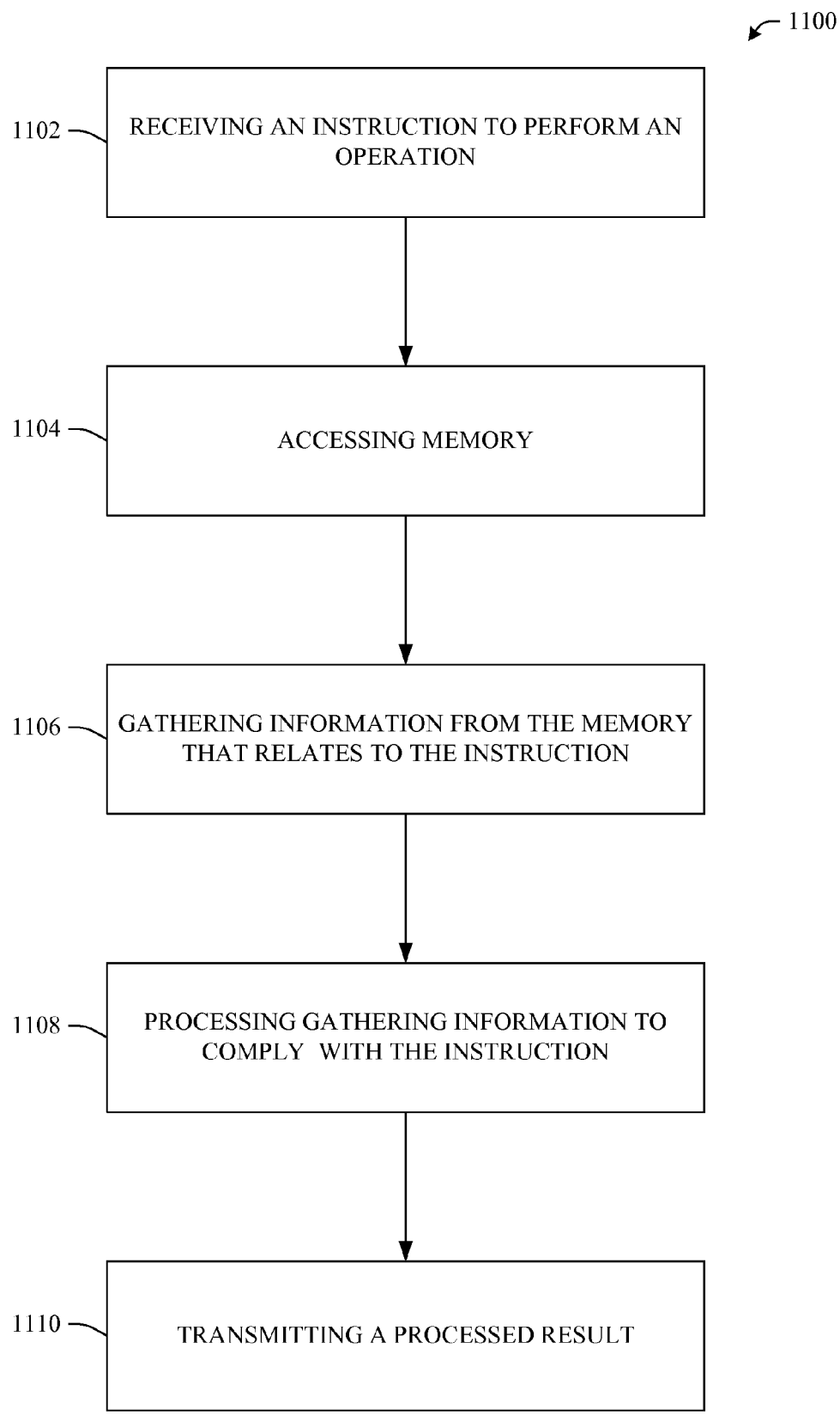
FIG. 11 discloses a representative configuration operation methodology in accordance with an aspect of the subject specification.

FIG. 11 discloses an example methodology 1100 for operation of a constructed unit. Initially, there is receiving an instruction to perform an operation 1102 by a processor. An instruction can originate from a number of different locations. A user can engage a user interface that sends an instruction to the processor (e.g., a user request to determine if a new e-mail has entered an inbox). Furthermore, internal electronic device functions can originate an instruction (e.g., performing a virus check once a month).

Accessing memory 1104 takes place from the processor to a storage unit. The memory holds information that can be useful in processor operations. For example, memory can be used to allow a processor to determine priority in which received instructions should be executed (e.g., a first received instruction should be executed before a second received instruction.) The memory can take a number of different forms, including Static Random Access Memory, Dynamic Random Access Memory, flash memory, etc.

Gathering information from the memory that relates to the instruction 1106 can take place. Memory can hold a relatively large amount of information and it is likely the processor can execute the instruction with a portion of the memory contents. Therefore, selective information retrieval takes place so the processor does not become over-burdened with information. A processor can configure to identify information that can be useful in executing an instruction and that information is gathered.

There can be processing gathered information to comply with the instruction 1108 performed by the processor. Processing allows the processor to comply with the instruction. For instance, a user can request that the processor sort a list of values alphabetically. From the information gathered, the processor then rearranges the items in an ascending manner alphabetically. That new list becomes the processed result 1110.

Transmitting a processed result 1110 occurs, typically after completion of event 1108. It can be beneficial that a result of an instruction be transmitted to a user (e.g., a number of messages in a user inbox). Therefore, the processed result can be emitted to an auxiliary location (e.g., to a monitor to inform the user how many messages are in the user inbox). However, it is to be appreciated that action 1110 can occur prior to the conclusion of event 1108 (e.g., as new messages are discovered, their status is sent to a user before completion of processing.)

For purposes of simplicity of explanation, methodologies that can be implemented in accordance with the disclosed subject matter were shown and described as a series of blocks. However, it is to be understood and appreciated that the claimed subject matter is not limited by the order of the blocks, as some blocks can occur in different orders and/or concurrently with other blocks from what is depicted and described herein. Moreover, not all illustrated blocks can be required to implement the methodologies described hereinafter.

Furthermore, there are advantages to using configurations, systems, methodologies, etc. of the subject specification. Typically, high-speed serial interfaces use complex analog circuits to overcome eye degradation due to channel effects, crosstalk and simultaneous switching noise effects. Use of Multi-Chip Modules (MCMs) to connect a processing unit to memory can utilize relatively high fine pitch printed circuit board (PCB) wiring and costly multi-layer laminates. Compared to MCMs, because of direct contact using flip-chip, the absence of interconnect wiring (e.g., as disclosed in the subject specification through utilization of contact areas) reduces unwanted effects and it reduces signaling power consumption.

Consequently, there is simplification of I/O buffers in terms of size as well as complexity. As an example, a typical high-end central processing unit (CPU)/graphical processing unit (GPU) with a die size of about 10000 micrometers (um.) Assuming a signal periphery depth of about 8 bumps and conservatively allocating about 100 um per buffer as well as reserving about ⅓ of the bumps for power/ground interconnections, there are over about 533 signals, which has a bandwidth equivalent to about 6 bus channels (e.g., about 64 bit bidirectional data and about 20 for multiplexed row/column address bits, control signals and clock.) Strobes can be eliminated and control signals reduced. Since the connection is by direct contact, speeds in excess of about 1 GigaTransfers (GT)/second (sec.) is attainable. This gives about 48 GigaBytes (GB)/sec. of bandwidth and if the other side of the die is also utilized, a total of about 106 GB/sec. bandwidth is achievable. If there is no desire to have independent channels, there can be about 512-bit 1 GT/sec. bidirectional interface giving a total of about 64 GB/sec. bandwidth per side, or about 128 GB/sec. for about two sides. Bandwidth can further be increased by multi-level signaling techniques or simultaneous bi-directional techniques. Flip-chip manufacturing processes allow buffer allocation to about 50 um, which subsequently quadruples interconnection density and bandwidth accordingly by about 4× to about 512 GB/sec.

Other advantages can be present in practice of the subject specification. There is not a need to drive a transmission line, but instead there can be a driving of a flip-chip bump. Crosstalk, channel loss and simultaneous switching noise effects are also greatly reduced, allowing a higher rate of data transmission. Moreover, practice of aspects of the subject specification can eliminate wafer-processing steps that are costly in the construction of processor packages.

Figure 12:
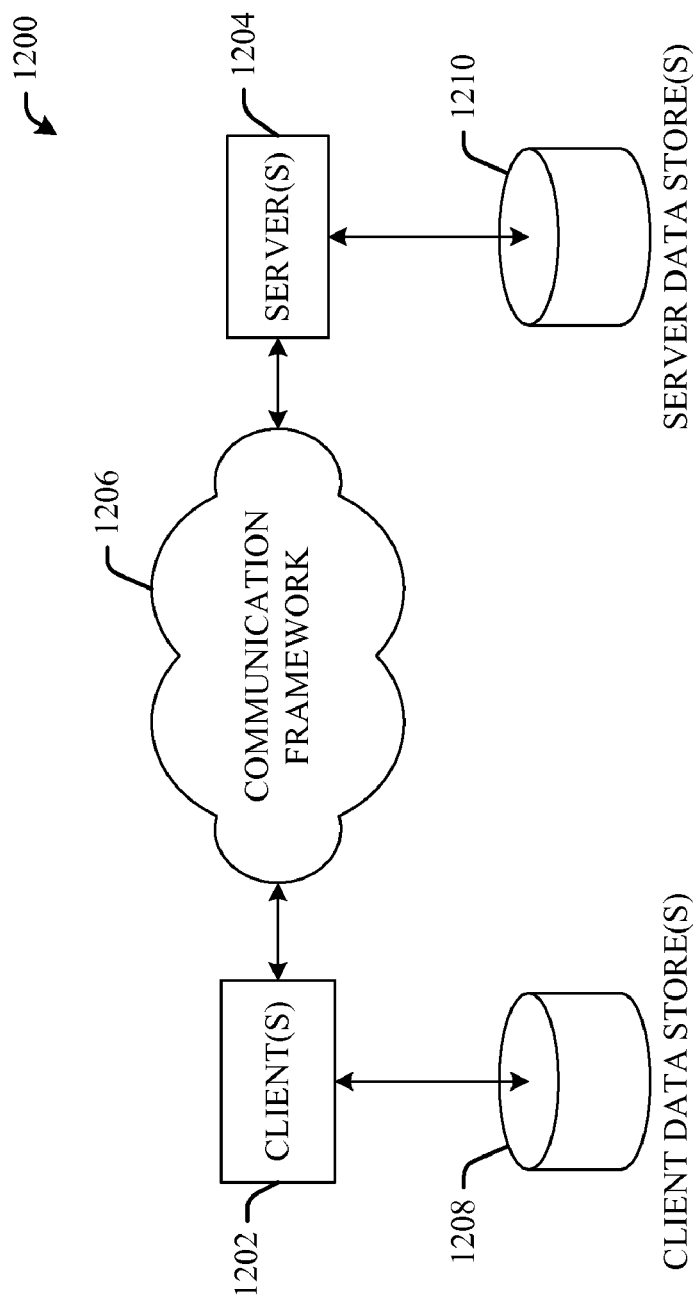
FIG. 12 illustrates an example of a schematic block diagram of a computing environment in accordance with the subject specification.
Figure 13:
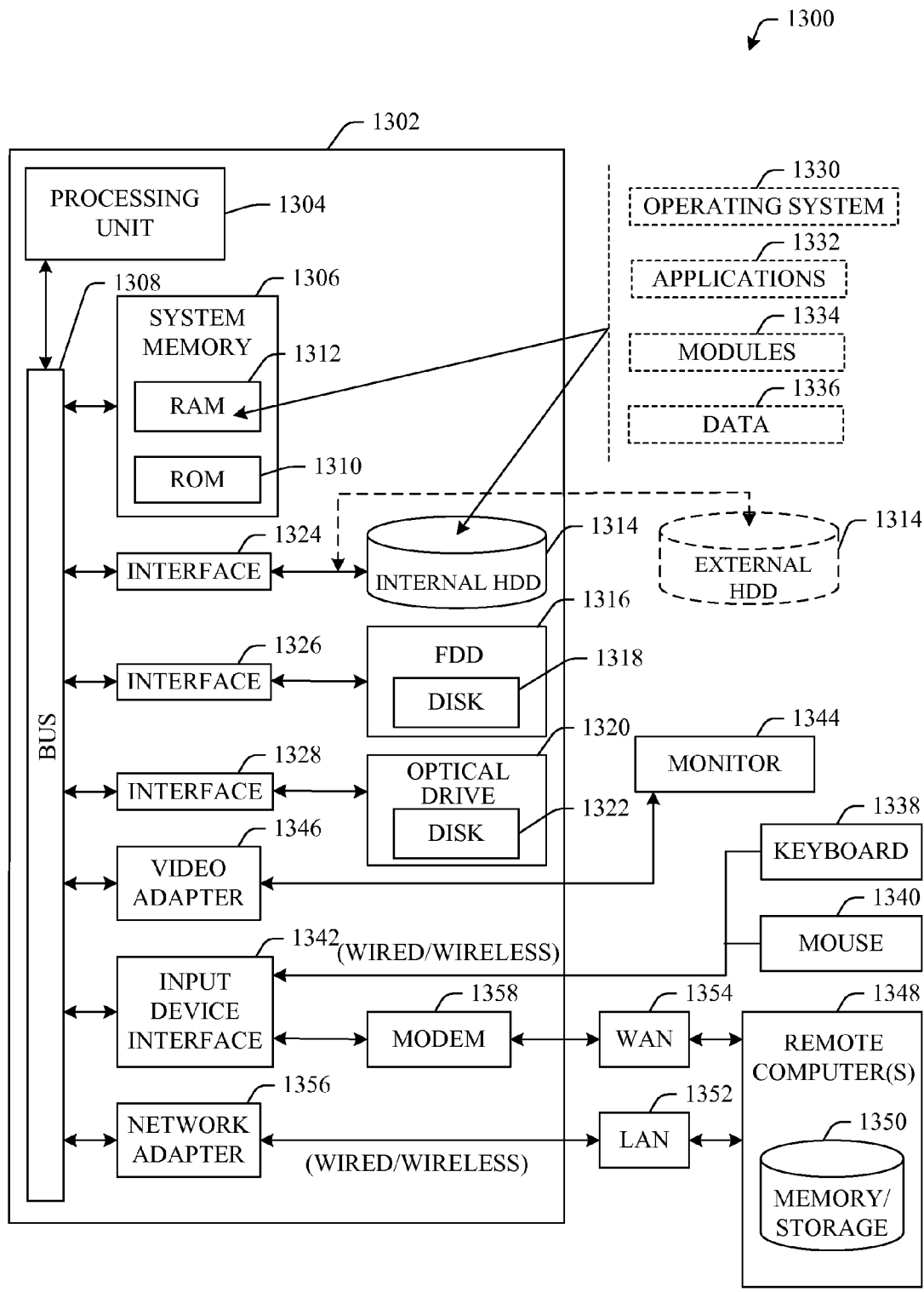
FIG. 13 illustrates an example of a block diagram of a computer operable to execute the disclosed architecture.

In order to provide a context for the various aspects of the disclosed subject matter, FIGS. 12 and 13 as well as the following discussion are intended to provide a brief, general description of a suitable environment in which the various aspects of the disclosed subject matter can be implemented. While the subject matter has been described above in the general context of computer-executable instructions of a program that runs on one or more computers, those skilled in the art will recognize that the subject matter described herein also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor, multiprocessor or multi-core processor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects can also be practiced in distributed computing environments where tasks are performed by remote processing devices that are linked through a communications network. However, some, if not all aspects of the claimed subject matter can be practiced on stand-alone computers. In a distributed computing environment, program modules can be located in both local and remote memory storage devices.

Referring now to FIG. 12, there is illustrated a schematic block diagram of a computing environment 1200 in accordance with the subject specification. The system 1200 includes one or more client(s) 1202. The client(s) 1202 can be hardware and/or software (e.g., threads, processes, computing devices). The client(s) 1202 can house cookie(s) and/or associated contextual information by employing the specification, for example.

The system 1200 also includes one or more server(s) 1204. The server(s) 1204 can also be hardware and/or software (e.g., threads, processes, computing devices). The servers 1204 can house threads to perform transformations by employing the specification, for example. One possible communication between a client 1202 and a server 1204 can be in the form of a data packet adapted to be transmitted between two or more computer processes. The data packet can include a cookie and/or associated contextual information, for example. The system 1200 includes a communication framework 1206 (e.g., a global communication network such as the Internet) that can be employed to facilitate communications between the client(s) 1202 and the server(s) 1204.

Communications can be facilitated via a wired (including optical fiber) and/or wireless technology. The client(s) 1202 are operatively connected to one or more client data store(s) 1208 that can be employed to store information local to the client(s) 1202 (e.g., cookie(s) and/or associated contextual information). Similarly, the server(s) 1204 are operatively connected to one or more server data store(s) 1210 that can be employed to store information local to the servers 1204.

Referring now to FIG. 13, there is illustrated a block diagram of a computer operable to execute the disclosed architecture. In order to provide additional context for various aspects of the subject specification, FIG. 13 and the following discussion are intended to provide a brief, general description of a suitable computing environment 1300 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the specification can also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 13, the example environment 1300 for implementing various aspects of the specification includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi-processor architectures can also be employed as the processing unit 1304.

The system bus 1308 can be any of several types of bus structure that can further interconnect to a memory bus (with or without a memory controller), a peripheral bus, and a local bus using any of a variety of commercially available bus architectures. The system memory 1306 includes read-only memory (ROM) 1310 and random access memory (RAM) 1312. A basic input/output system (BIOS) is stored in a non-volatile memory 1310 such as ROM, EPROM, EEPROM, which BIOS contains the basic routines that help to transfer information between elements within the computer 1302, such as during start-up. The RAM 1312 can also include a high-speed RAM such as static RAM for caching data.

The computer 1302 further includes an internal hard disk drive (HDD) 1314 (e.g., EIDE, SATA), which internal hard disk drive 1314 can also be configured for external use in a suitable chassis (not shown), a magnetic floppy disk drive (FDD) 1316, (e.g., to read from or write to a removable diskette 1318) and an optical disk drive 1320, (e.g., reading a CD-ROM disk 1322 or, to read from or write to other high capacity optical media such as the DVD). The hard disk drive 1314, magnetic disk drive 1316 and optical disk drive 1320 can be connected to the system bus 1308 by a hard disk drive interface 1324, a magnetic disk drive interface 1326 and an optical drive interface 1328, respectively. The interface 1324 for external drive implementations includes at least one or both of Universal Serial Bus (USB) and IEEE 13104 interface technologies. Other external drive connection technologies are within contemplation of the subject specification.

The drives and their associated computer-readable media provide nonvolatile storage of data, data structures, computer-executable instructions, and so forth. For the computer 1302, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, can also be used in the example operating environment, and further, that any such media can contain computer-executable instructions for performing the methods of the specification.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. It is appreciated that the specification can be implemented with various commercially available operating systems or combinations of operating systems.

A user can enter commands and information into the computer 1302 through one or more wired/wireless input devices, e.g., a keyboard 1338 and a pointing device, such as a mouse 1340. Other input devices (not shown) can include a microphone, an IR remote control, a joystick, a game pad, a stylus pen, touch screen, or the like. These and other input devices are often connected to the processing unit 1304 through an input device interface 1342 that is coupled to the system bus 1308, but can be connected by other interfaces, such as a parallel port, an IEEE 13104 serial port, a game port, a USB port, an IR interface, etc.

A monitor 1344 or other type of display device is also connected to the system bus 1308 via an interface, such as a video adapter 1346. In addition to the monitor 1344, a computer typically includes other peripheral output devices (not shown), such as speakers, printers, etc.

The computer 1302 can operate in a networked environment using logical connections via wired and/or wireless communications to one or more remote computers, such as a remote computer(s) 1348. The remote computer(s) 1348 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1350 is illustrated. The logical connections depicted include wired/wireless connectivity to a local area network (LAN) 1352 and/or larger networks, e.g., a wide area network (WAN) 1354. Such LAN and WAN networking environments are commonplace in offices and companies, and facilitate enterprise-wide computer networks, such as intranets, all of which can connect to a global communications network, e.g., the Internet.

When used in a LAN networking environment, the computer 1302 is connected to the local network 1352 through a wired and/or wireless communication network interface or adapter 1356. The adapter 1356 can facilitate wired or wireless communication to the LAN 1352, which can also include a wireless access point disposed thereon for communicating with the wireless adapter 1356.

When used in a WAN networking environment, the computer 1302 can include a modem 1358, or is connected to a communications server on the WAN 1354, or has other means for establishing communications over the WAN 1354, such as by way of the Internet. The modem 1358, which can be internal or external and a wired or wireless device, is connected to the system bus 1308 via the serial port interface 1342. In a networked environment, program modules depicted relative to the computer 1302, or portions thereof, can be stored in the remote memory/storage device 1350. It will be appreciated that the network connections shown are example and other means of establishing a communications link between the computers can be used.

The computer 1302 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11(a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

Various unexpected advantages take place over conventional configurations when implementing the disclosed innovation. The innovation can encompass several apparatus/configurations (e.g., with a power/ground carrier, with a slot/recess, etc.) in conjunction with unique methods of manufacturing apparatus/configuration. As an illustrative example, design of processor and memory pads can be such that appropriate signal pads overlap correctly while power/ground pads are located in a middle of a processor. In addition, a method of manufacture of the package laminate/substrate with recess/slot or the package laminate/substrate with power carrier can occur.

Direct signal contact between processor and memory contact pads using solder bonds/bumps can be used. Bonding between the processor and memory contact pads can be achieved with existing flip-chip processes that is cheap and highly manufacturable. Altering signal contact between the processor and memory contact pads goes against a market trend of creating different processes and/or different components. Practice of the innovation can allow more contact pads, high bandwidth, better signal quality and lower signal latency compared to a conventional multi-chip-module. In addition, practice of the innovation has an unexpected result of allowing a use of processor and memory components with pads on one side alone, which are cheaper to manufacture compared to processor and memory components with pads on both sides of silicon (e.g., to make pads on both sides of the silicon, silicon holes are generally created on silicon, which is costly and difficult to manufacture).

Classic configurations of direct contact between processor signal pads and memory signal pads are unable to overcome an issue of supplying power/ground to the processor and memory. Whereas the signals involve the processor and memory, the power/ground are sourced externally in a classic configuration. In the disclosed innovation, there is circumventing of this issue by ensuring that the processor and memory signal pads are designed such that the signals are located on the periphery while the power/ground pads are in the middle, using a power/ground carrier, or using a recess/slot method Lastly, another advantage that arises from the innovation is aspects can be extended two-dimensionally to incorporate more processors and memories as needed.

What has been described above includes examples of the present specification. It is, of course, not possible to describe every conceivable combination of components or methodologies for purposes of describing the present specification, but one of ordinary skill in the art can recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a processor with at least one processor active contact area located along at least part of a periphery of the processor; and
a plurality of memory components located at least in part in a plurality of recesses of a substrate with at least one memory active contact area located along at least part of a periphery of the memory components that is configured to be an interface with the processor by physically and directly touching the processor active contact area, wherein the processor and memory components form a single integrated package and are configured to communicate through the interface with one another and communicate external of the single integrated package through the substrate.

2. The system of claim 1, wherein the processor receives power or ground through a carrier component.

3. The system of claim 1, wherein the interface consist of silicon and solder.

4. The system of claim 1, wherein the active contact area of the processor or contact area of the memory components is located only on one side.

5. The system of claim 1, wherein the processor or the memory components receive power through a non-periphery active contact area.

6. The system of claim 1, wherein at least two memory components can communicate with the processor through the processor active contact area.

7. The system of claim 1, wherein at least two processors can communicate with the memory components through the memory active contact area.

8. The system of claim 1, wherein at least one secondary memory component can communicate with the processor through the interface.

9. The system of claim 1, wherein at least one secondary processor can communicate with the processor through the interface.

10. The system of claim 1, further comprising a redistributor component that supplies power or ground to the memory components.

11. The system of claim 1, further comprising a carrier component that supplies power or ground to the processor.

12. The system of claim 1, further comprising an analysis component configured to test the interface between the processor and the memory components for errors.

13. The system of claim 1, further comprising a boundary layer placed between the memory components and the substrate that transfers heat away from the memory components.

14. A system, comprising:
   means for arranging an active contact section of a processor on top of active contact sections of memories that are placed at least in part in a plurality of recesses of a substrate; and
   means for engaging the processor with the memories, wherein the active contact section of the processor and the active contact section of the memories physically and communicatively link to one another by physically and directly touching, and communicatively link external of one another through the substrate.

15. The system of claim 14, further comprising means for analyzing the processor engaged with the memories.

16. The system of claim 14, further comprising means for creating a laminate capable of holding the processor engaged with the memories.

17. A method, comprising:
   aligning a periphery contact region of a processor directly over a periphery contact region of a plurality of storage memories that are placed at least in part in a plurality of depressions of a substrate;
   integrating the periphery contact region of the processor with the periphery contact region of the storage memories to physically and directly touch in a single integrated package; and
   communicating among the processor and the plurality of storage memories directly through the periphery contact region of the processor and the periphery contact region of the storage memories, and communicating externally of the single integrated package through the substrate.

18. The method of claim 17, further comprising at least one of:
   aligning a power or ground carrier to a non-periphery contact region of the processor;
   integrating the non-periphery contact region of the processor with the power or ground carrier;
   aligning a power or ground connector to a non-periphery contact regions of the storage memories; or
   integrating the power or ground connector with the storage memories.

19. The method of claim 17, further comprising creating the substrate with a depression.

20. The method of claim 17, further comprising testing an interface between the storage memories and the processor.

* * * * *